United States Patent
Agarwala et al.

(10) Patent No.: US 9,582,625 B2
(45) Date of Patent: Feb. 28, 2017

(54) TEST BENCH TRANSACTION SYNCHRONIZATION IN A DEBUGGING ENVIRONMENT

(71) Applicants: Badruddin Agarwala, Pleasanton, CA (US); Tarak Parikh, San Jose, CA (US); Vivek Bhat, San Jose, CA (US); Neeraj Joshi, Fremont, CA (US)

(72) Inventors: Badruddin Agarwala, Pleasanton, CA (US); Tarak Parikh, San Jose, CA (US); Vivek Bhat, San Jose, CA (US); Neeraj Joshi, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 914 days.

(21) Appl. No.: 13/924,156

(22) Filed: Jun. 21, 2013

(65) Prior Publication Data

US 2014/0005999 A1  Jan. 2, 2014

Related U.S. Application Data

(60) Provisional application No. 61/663,116, filed on Jun. 22, 2012.

(51) Int. Cl.
*G06F 17/50* (2006.01)

(52) U.S. Cl.
CPC ...... *G06F 17/5045* (2013.01); *G06F 17/5022* (2013.01)

(58) Field of Classification Search
USPC .......... 703/3, 22, 24; 716/102; 324/500
See application file for complete search history.

(56) References Cited

U.S. PATENT DOCUMENTS

| | | | |
|---|---|---|---|
| 5,920,711 A | 7/1999 | Seawright et al. | |
| 6,892,154 B1 * | 5/2005 | Lee | G01R 31/2834 324/500 |
| 8,051,402 B2 | 11/2011 | Snell | |
| 8,140,315 B2 | 3/2012 | Walter et al. | |
| 8,255,198 B2 | 8/2012 | Krishnaswamy et al. | |
| 8,560,893 B1 | 10/2013 | Hollander et al. | |
| 8,560,985 B1 | 10/2013 | Sahu et al. | |
| 8,620,638 B1 * | 12/2013 | Chan | G06F 17/5022 703/13 |
| 9,081,924 B2 * | 7/2015 | Chen | G06F 11/3672 |
| 2002/0108094 A1 * | 8/2002 | Scurry | G06F 17/5022 716/102 |

(Continued)

*Primary Examiner* — Thai Phan

(74) *Attorney, Agent, or Firm* — Mentor Graphics Corporation

(57) ABSTRACT

This application discloses a design verification tool to simulate a circuit design with a test bench to generate a simulated output for the circuit design and a simulation log corresponding to operation of the test bench during the simulation of the circuit design. The design verification tool can determine whether the simulated output for the circuit design is different than an expected output for the circuit design. A debug tool can synchronize the simulated output for the circuit design with test bench transactions from the simulation log that prompted the generation of the simulated output for the circuit design when the simulated output of the circuit design is different than the expected output of the circuit design.

39 Claims, 9 Drawing Sheets

(56) References Cited

U.S. PATENT DOCUMENTS

| | | |
|---|---|---|
| 2003/0139892 A1* | 7/2003 | Bauer .................. G06F 11/261 |
| | | 702/117 |
| 2007/0226542 A1 | 9/2007 | Beeston et al. |
| 2008/0147372 A1 | 6/2008 | Paulsen |
| 2009/0083683 A1 | 3/2009 | Snell |
| 2009/0112554 A1 | 4/2009 | Walter et al. |
| 2011/0238397 A1* | 9/2011 | Chen .................. G06F 11/3672 |
| | | 703/13 |
| 2012/0240022 A1 | 9/2012 | Bakshi |
| 2013/0227367 A1* | 8/2013 | Czamara ............ G01R 31/3177 |
| | | 714/735 |

* cited by examiner

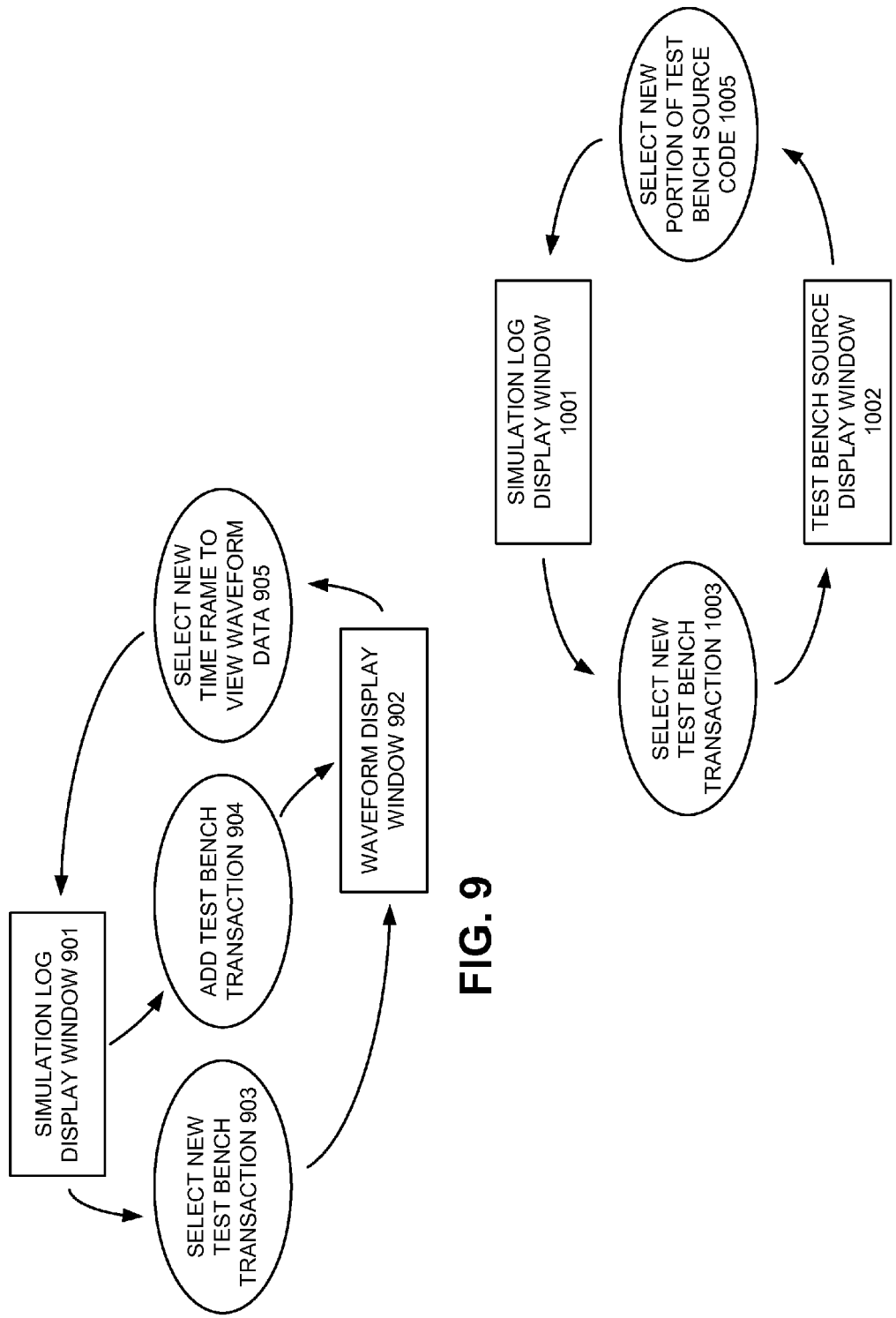

TEST BENCH TRANSACTION SYNCHRONIZATION IN A DEBUGGING ENVIRONMENT

RELATED APPLICATION

This application claims benefit of and priority to U.S. Provisional Patent Application No. 61/663,116, filed Jun. 22, 2012, which is incorporated by reference herein.

TECHNICAL FIELD

This application is generally related to electronic design automation and, more specifically, to synchronization of simulated output from a circuit design with test bench transactions in a debugging environment

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design can be again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to "functional verification," this type of analysis begins with a circuit design coded at a register transfer level (RTL), which can be simulated by a design verification tool. A designer, for example, utilizing the design verification tool, can generate a test bench that, when input to the simulated circuit design, can allow the design verification tool to analyze the functionality of the simulated circuit design. When the simulated circuit design operates differently than expected in response to the test bench, the designer can attempt to debug the circuit design, for example, to determine which of the gates in the circuit design is incorrectly configured, resulting in the generation of illegal states or transitions.

The design verification tool can record signal states and transitions of the circuit design, often called waveform data, which the designer can review in an attempt to identify a "bug" in the circuit design. The designer typically can utilize a debug tool to review the recorded waveforms, often alongside a source code of the circuit design, in an attempt to locate and address the circuit design failure.

Often, however, the simulated circuit design can operate differently than expected, not due to a "bug" in the circuit design, but due to a defect in the test bench, for example, incorrect stimulus being applied to the simulated circuit design, improper response checking, or both. Thus, the designer may attempt to review test bench states and transitions, a source code of the test bench, a source code of the circuit design, and the waveform data, often in unison, to ascertain whether the verification failure was the result of a "bug" in the circuit design, a test bench defect, or both.

Since many test benches are generated with object-oriented programming languages that are transient in nature, for example, with object components, such as classes, being created and destroyed during execution, test bench states and transitions are recorded separately from and in a different format than the waveform data of the simulated circuit design, leaving designers to manually collate test bench states and transitions with the waveform data.

SUMMARY

This application discloses tools and mechanisms for simulating a circuit design with a test bench, performing functional verification on the simulated circuit design, and, when functional verification fails, preparing data from operation of both the circuit design and test bench during the simulation. In some embodiments, a design verification tool can simulate a circuit design with a test bench to generate a simulated output for the circuit design and a simulation log corresponding to operation of the test bench during the simulation of the circuit design. The design verification tool can determine whether the simulated output for the circuit design is different than an expected output for the circuit design. A debug tool can synchronize the simulated output for the circuit design with test bench transactions from the simulation log that prompted the generation of the simulated output for the circuit design when the simulated output of the circuit design is different than the expected output of the circuit design.

DESCRIPTION OF THE DRAWINGS

FIG. 9 illustrates a flowchart showing an example implementation of synchronization between a simulation log display window and a waveform display window according to various examples of the invention.

FIG. 10 illustrates a flowchart showing an example implementation of synchronization between a test bench transaction display window and a test bench source display window according to various examples of the invention.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
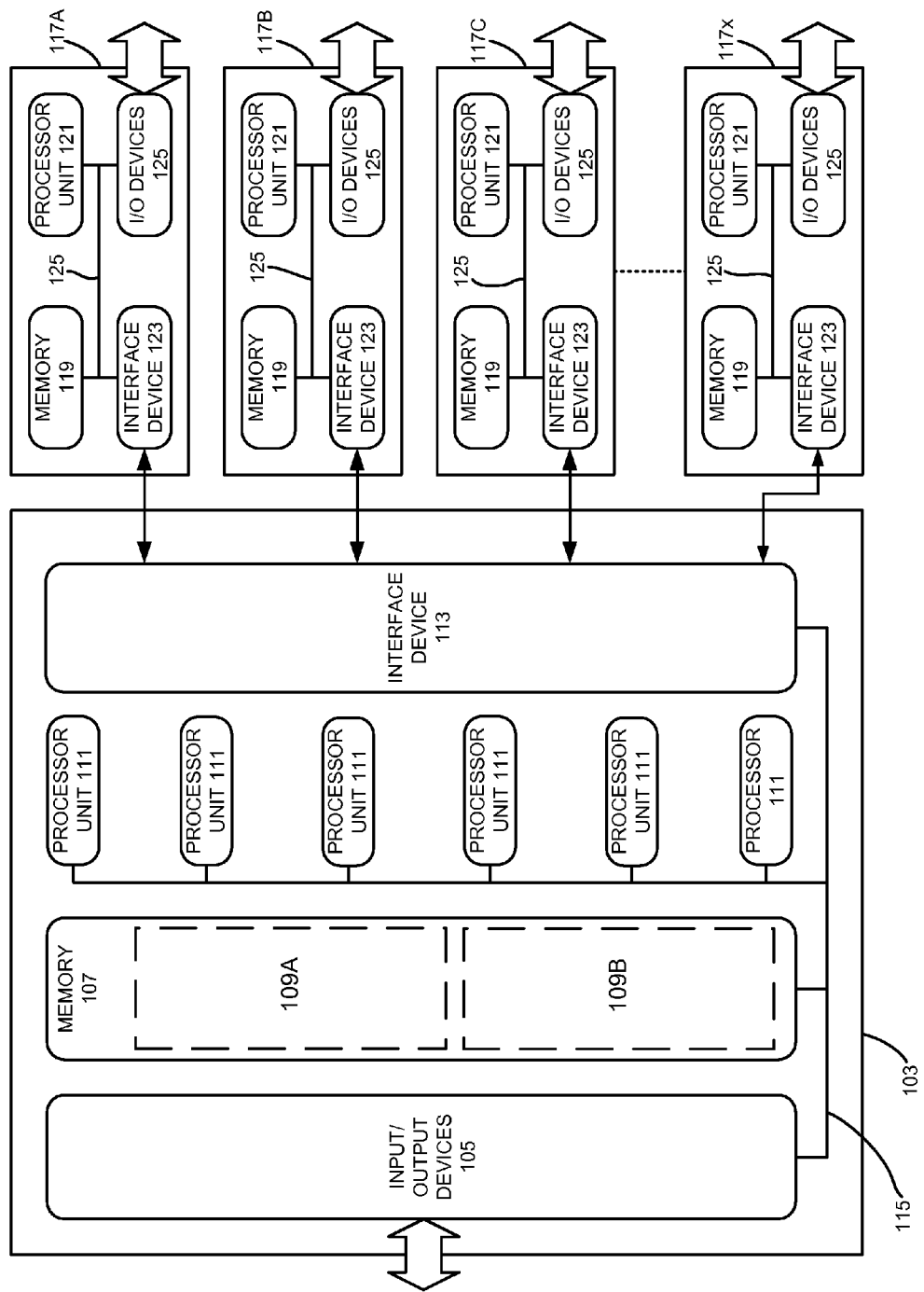
FIGS. 1 and 2 illustrate an example of a computer system of the type that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
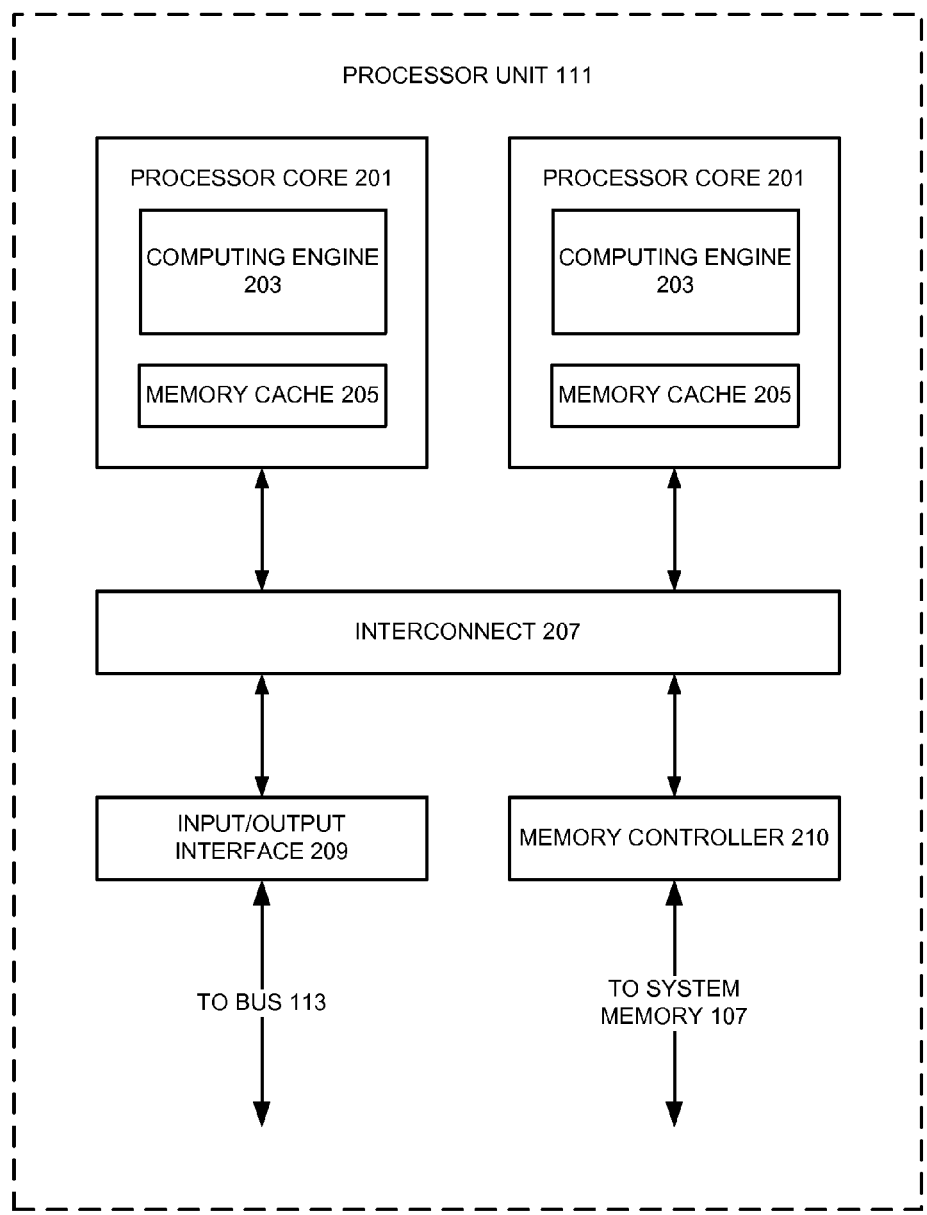

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117X through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Debug Tool with Test Bench Transaction Synchronization

Figure 3:
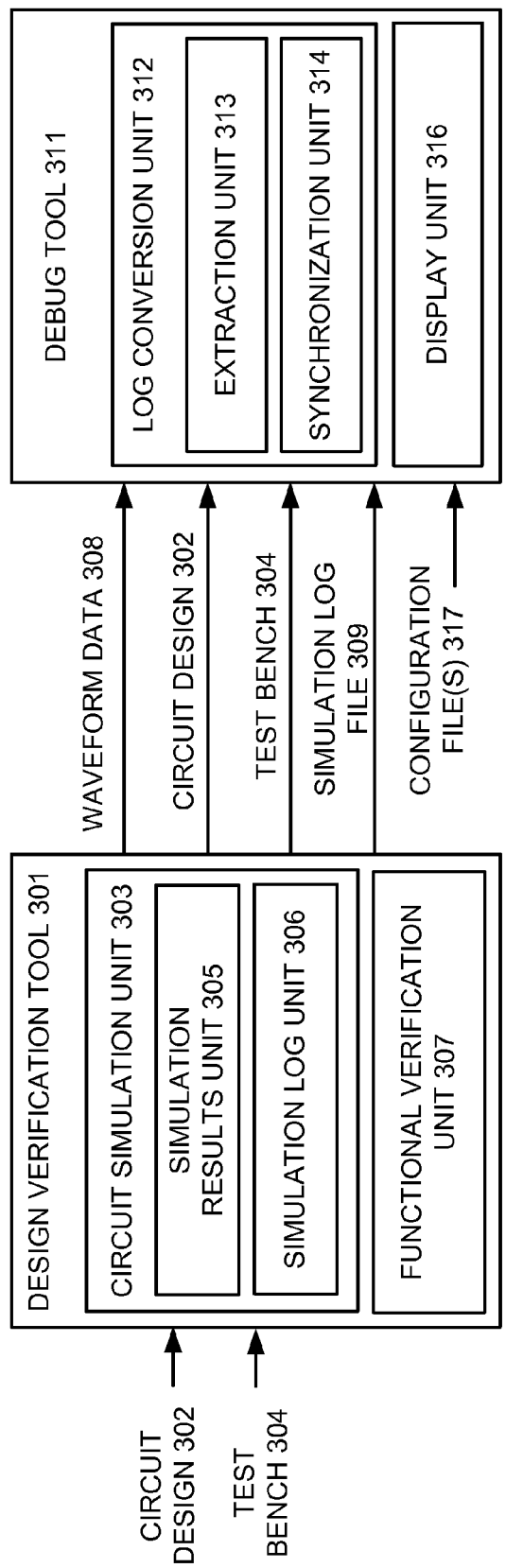
FIG. 3 illustrates an example system including a design verification tool and a debug tool that may be implemented according to various embodiments of the invention.

FIG. 3 illustrates an example system including a design verification tool 301 and a debug tool 311 that may be implemented according to various embodiments of the invention. Although FIG. 3 shows the design verification tool 301 separate from the debug tool 311, in some embodiments, the design verification tool 301 and the debug tool 311 can be integrated into a common tool. Referring to FIG. 3, the design verification tool 301 can receive a circuit design 302, which can describe an electronic device both in terms of an exchange of data signals between components in the electronic device, such as hardware registers, flip-flops, combinational logic, or the like, and in terms of logical operations that can be performed on the data signals in the electronic device. The circuit design 302 can model the electronic device at a register transfer level (RTL), for example, with code in a hardware description language (HDL), such as Verilog, Very high speed integrated circuit Hardware Design Language (VHDL), or the like.

The design verification tool 301 can include a circuit simulation unit 303 to simulate the circuit design 302 based, at least in part, on a test bench 304. The test bench 304 can define test stimuli, for example, clock signals, activation signals, power signals, control signals, and data signals that, when grouped, may form test bench transactions capable of prompting operation of the circuit design 302 during simulation. In some embodiments, the test bench 304 can be written in an object-oriented programming language, for example, SystemVerilog or the like. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 304 and simulating the circuit design 302. In some embodiments, the design verification tool 301 can receive the test bench 304 from a source external to the design verification tool 301, such as a user interface of the computer network 101, another tool implemented by the computer network 101, or the design verification tool 301 may generate the test bench 304 internally.

The circuit simulation unit 303 can include a simulation results unit 305 to record output created by the circuit design 302 during simulation with the test bench 304. The simulated output can include waveform data 308, simulation results in other formats, or the like. The circuit simulation unit 303 can include a simulation log unit 306 to record operations of or messages generated by the test bench 304 during simulation into a simulation log file 309. In some embodiments, the simulation log unit 306 can utilize default logging classes in at least one of the methodology libraries to capture the operations of or messages generated by the test bench 304 during simulation and record them in the simulation log file 309 in a predefined format.

The design verification tool 301 can include a functional verification unit 307 to compare the waveform data 308 with an expected output from the circuit design 302 in response the test bench 304. The functional verification unit 307 can verify the functionality of the circuit design 302 when the waveform data 308 indicates the circuit design 302 operates as expected based on the comparison. When the waveform data 308 indicates the circuit design 302 operates differently than expected based on the comparison, the functional verification unit 307 can determine a "bug" or other defect is present in the circuit design 302 and/or in the test bench 304. Although FIG. 3 shows the design verification tool 301 including the functional verification unit 307, in some embodiments, the functional verification unit 307 can be located external to the design verification tool 301.

When the functional verification unit 307 determines a "bug" or other defect is present in the circuit design 302 or in the test bench 304, designer(s) can utilize a debug tool 311 to isolate the "bug" in the circuit design 302 and/or test bench 304. The debug tool 311 can receive the circuit design 302, the test bench 304, the waveform data 308, and the simulation log file 309, for example, from the design verification tool 301.

The debug tool 311 can include a log conversion unit 312 to convert the simulation log file 309 into a format allowing the debug tool 311 to present information regarding the operations of the circuit design 302 and the test bench 304 during simulation in a synchronous and coordinated manner. The debug tool 311 can include an extraction unit 312 to parse through the simulation log file 309 to identify test bench transactions, for example, a message or group of messages generated by the test bench 304 during simulation, and extract them from the simulation log file 309. In some embodiments, the extraction unit 312 can extract test bench transactions from the simulation log file 309 based on configuration file(s) 317, for example, received by the debug tool 311. The configuration file(s) 317 can direct parsing operations of the extraction unit 313, for example, by identifying types of messages for the extraction unit 313 to extract from the simulation log file 309, by identifying a format for the extracted test bench transactions, or the like.

The test bench transactions in the simulation log file 309 can include different types of information, such as contextual information and message content. The contextual information can include a simulation time (a time during the simulation that the message was generated or provided to the circuit design 302), an identification of the test bench 304 utilized during the simulation of the circuit design 302, a line number in the test bench 304 corresponding to the test bench transaction, and a scope of the test bench transaction or message. The content of the message can identify the action prompted by the message or the test bench transaction. Embodiments for extracting test bench transactions from the simulation log file 309 will be described below in greater detail.

The debug tool 311 can include a synchronization unit 315 to associate the test bench transactions with the waveform data 308 and/or the test bench 304. For example, the synchronization unit 315 can temporally synchronize the test bench transactions with the waveform data 308, i.e., linking each test bench transaction to the actions or results in the simulated circuit design caused at least in part by (or occurring substantially simultaneously with) the test bench transaction during simulation. The synchronization unit 315 can synchronize the test bench transactions with the test bench 304, for example, by associating the test bench transactions to those portions of the test bench source code utilized to generate the test bench transactions during simulation.

The debug tool 311 can include a display unit 316 to prompt presentation of one or more display windows capable of population with information corresponding to the test bench transactions from the simulation log file 309, the waveform data 308, the circuit design 302, and/or the test bench 304. For example, the display unit 316 can prompt presentation of the waveform data 308 alongside the source code of the circuit design 302, which can allow the designer(s) to review the waveform data 308 and the circuit design 302 to isolate the "bug" identified by the functional verification unit 307. The display unit 316 also can prompt presentation of the test bench transactions during the debug process. Since the log conversion unit 312 synchronized the test bench transactions to the test bench 304 and the waveform data 308, the display unit 316 can prompt presentation of the test bench transactions alongside and synchronized with the waveform data 308 and/or the test bench 304 in one or more display windows. Embodiments for displaying test bench transactions will be described below in greater detail.

Figure 4:
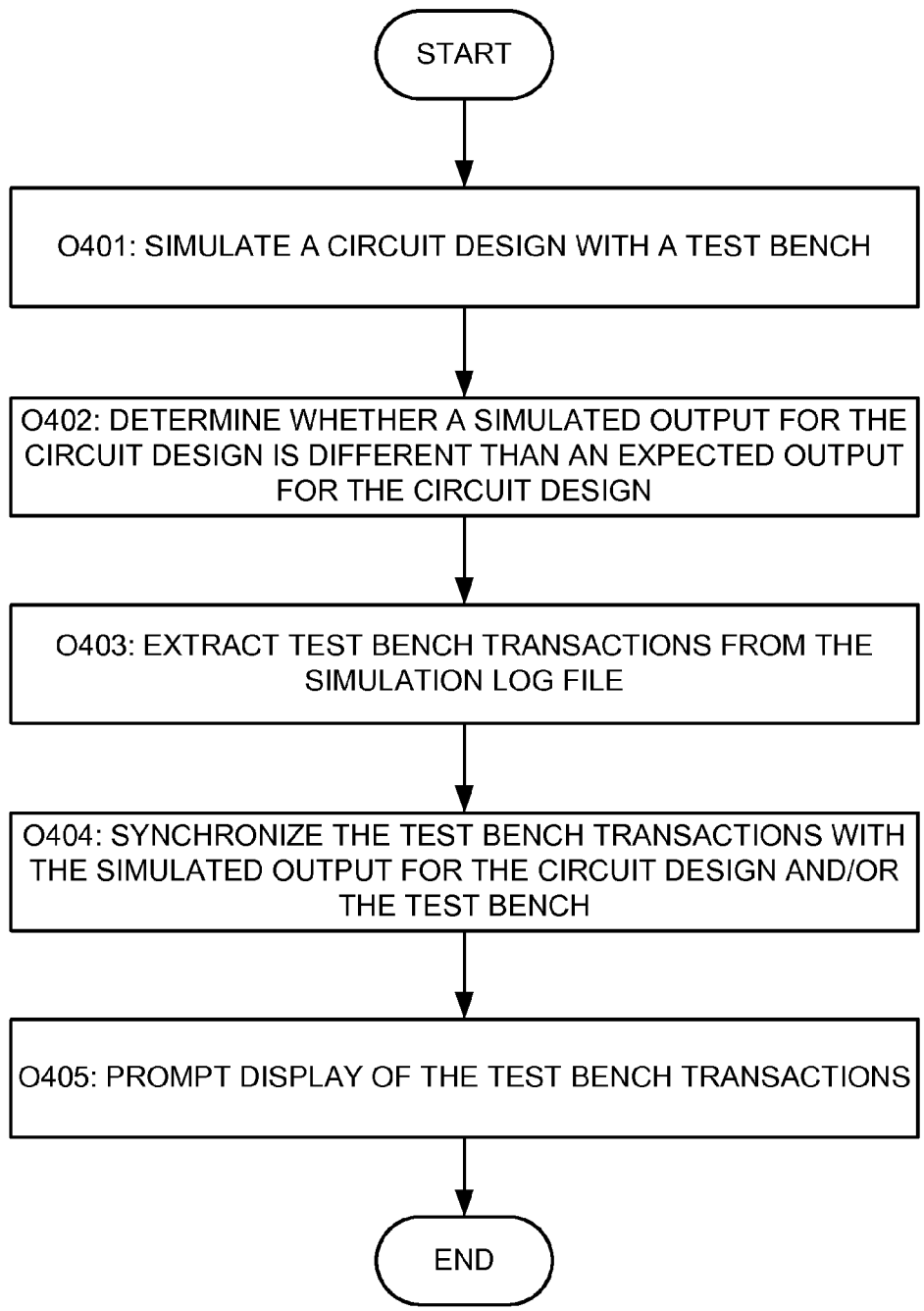
FIG. 4 illustrates a flowchart showing an example implementation of test bench transaction synchronization with waveform data and/or test bench source code according to various examples of the invention.

FIG. 4 illustrates a flowchart showing an example implementation of test bench transaction synchronization with waveform data and/or test bench source code according to various examples of the invention. Referring to FIG. 4, in block 401, a design verification tool can simulate a circuit design with a test bench. The design verification tool can record output created by the circuit design during simulation with the test bench, called waveform data or simulation results. The design verification tool also can record operation of the test bench during simulation into a simulation log file. In some embodiments, the design verification tool can utilize default logging classes in at least one of the methodology libraries to capture the operations of or messages generated by the test bench during simulation and record them in the simulation log file in a predefined format.

In a block 402, the design verification tool can determine whether a simulated output for the circuit design is different than an expected output for the circuit design. The design verification tool can verify the functionality of the circuit design when the waveform data indicates the circuit design operates as expected. When the waveform data indicates the circuit design operates differently than expected, the design verification tool can determine a "bug" or other defect is present in the circuit design or in the test bench.

In a block 403, a debug tool can extract test bench transactions from the simulation log file, for example, when the waveform data indicates the circuit design operates differently than expected. The debug tool can parse through the simulation log file to identify test bench transactions and extract the from the simulation log file. In some embodiments, the debug tool can extract test bench transactions from the simulation log file based on configuration file(s), which can direct parsing operations of the debug tool, for example, by identifying types of messages for the debug tool to extract from the simulation log file, by identifying a format for the extracted test bench transactions, or the like. Embodiments for extracting test bench transactions from the simulation log file will be described below in greater detail.

In a block 404, the debug tool can synchronize the test bench transactions with the simulated output for the circuit design and/or the test bench. For example, the debug tool can temporally synchronize the test bench transactions with the waveform data, i.e., linking each test bench transaction to the actions or results in the simulated circuit design caused at least in part by (or occurring substantially simultaneously with) the test bench transaction during simulation. The debug tool can synchronize the test bench transactions with the test bench, for example, by associating the test bench transactions to those line numbers in the test bench source code utilized to generate the test bench transactions during simulation.

In a block 405, the debug tool can prompt display of the test bench transactions, which can be synchronized with the waveform data, the circuit design, and/or the test bench. For example, the test bench transactions can be displayed in one or more display windows synchronously with the waveform data and/or the test bench. In other words, in blocks 403 and 404, the debug tool can convert the simulation log file into a format allowing the debug tool, in block 405, to prompt presentation of information regarding the operations of the circuit design and the test bench during simulation in a synchronous and coordinated manner. Embodiments for displaying test bench transactions will be described below in greater detail.

Figure 5:
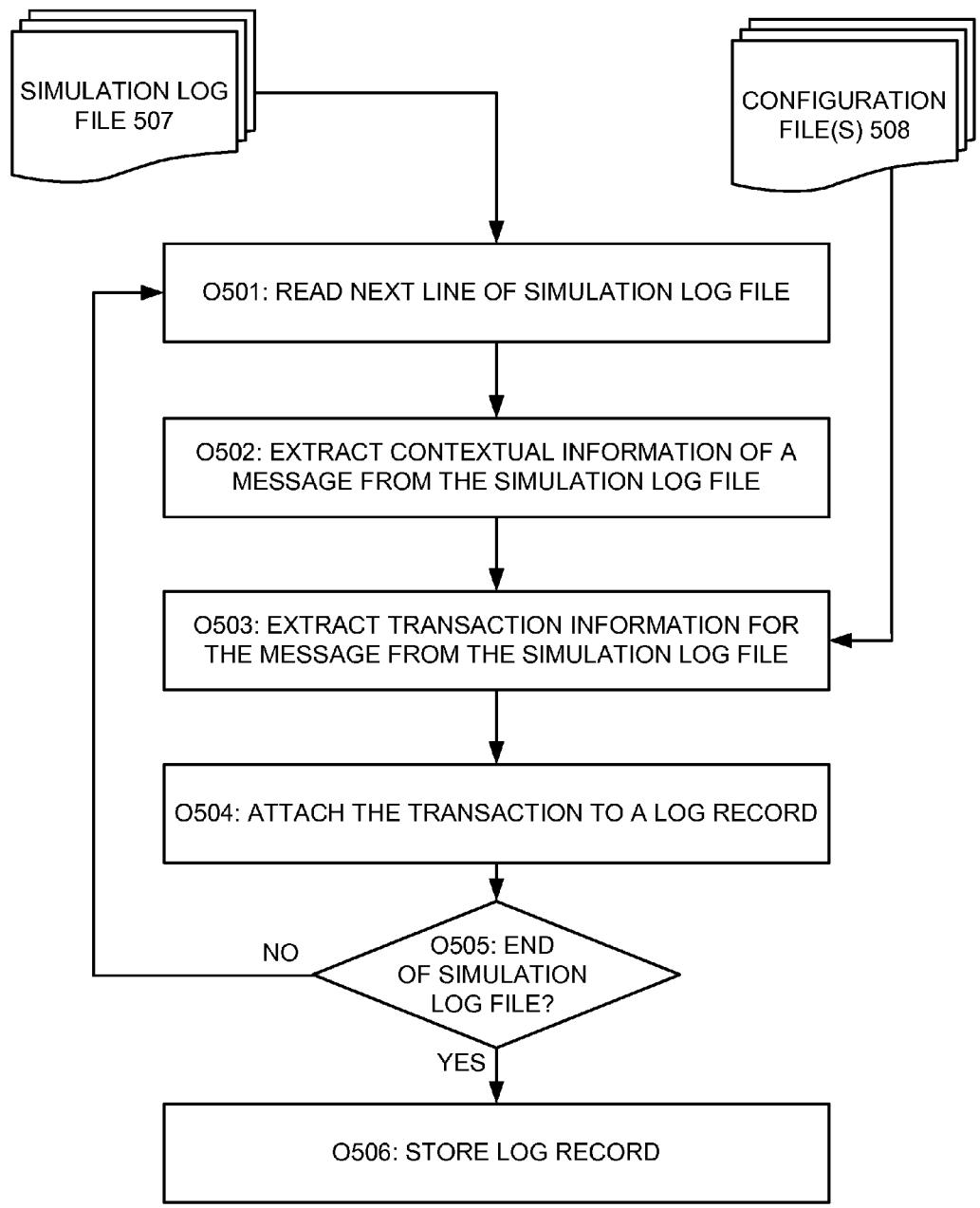
FIG. 5 illustrates a flowchart showing an example implementation of test bench transaction extraction from a simulation log according to various examples of the invention.

FIG. 5 illustrates a flowchart showing an example implementation of test bench transaction extraction from a simulation log file according to various examples of the invention. Referring to FIG. 5, in block 501, a debug tool can read a next line of a simulation log file 507. In some embodiments, the debug tool can receive the simulation log file 507 from a design verification tool or other device capable of transmitting the simulation log file 507 to the debug tool.

In a block 502, the debug tool can extract contextual information in a message from the next line in the simulation log file 507. In some embodiments, the contextual information can include a simulation time (a time during the simulation that the message was generated or provided to the circuit design), an identification of the test bench utilized during the simulation of the circuit design, a line number in the test bench corresponding to the test bench transaction, and a scope of the test bench transaction or message.

In a block 503, the debug tool can extract transaction information for the message from the next line in the simulation log file 507. The transaction information for the message can identify the type of operation for the circuit design to perform in response to the message. In some embodiments, the debug tool can extract transaction information from the simulation log file 507 based on configuration file(s) 508. The configuration file(s) 508 can direct parsing operations of the debug tool, for example, by identifying types of messages for the debug tool to extract from the simulation log file 507, by identifying a format for the extracted test bench transactions, or the like.

In a block 504, the debug tool can record a test bench transaction into a log record. In some embodiments, the debug tool can group test bench transactions by message type. For example, when the next line of the simulation log file 507 includes a message previously not seen before in this simulation log file 507, the debug tool can create a new entry in the log record for the test bench transaction. When the next line of the simulation log file 507 includes a message that has been seen before in this simulation log file 507, the debug tool can utilize a previous entry in the log record to record the test bench transaction.

In a block 505, the debug tool can determine whether an end of the simulation log file 507 has been reached. If the end of the simulation log file 507 has not been reached, execution is returned to block 501, where the debug tool can read a next line of a simulation log file 507. When the end of the simulation log file 507 has been reached, execution continues to a block 506, where the debug tool can store the log record, for example, to a log database accessible by the debug tool.

Figure 6:
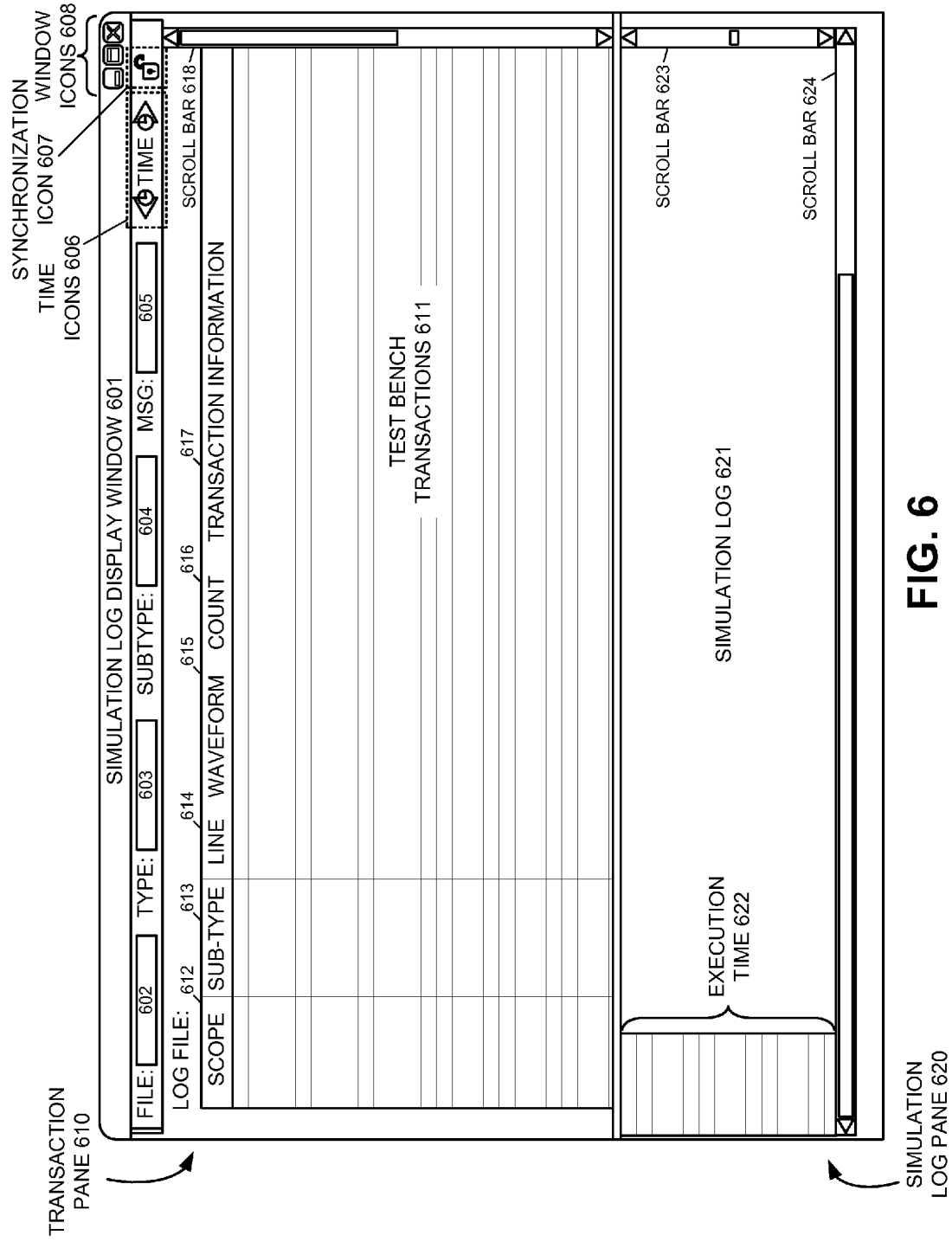
FIG. 6 illustrates an example simulation log display window according to various embodiments of the invention.

FIG. 6 illustrates an example simulation log display window 601 according to various embodiments of the invention. Referring to FIG. 6, the simulation log display window 601 can include a transaction pane 610 and a simulation log pane 620. The transaction pane 610 can include a list of test bench transactions 611 extracted from a simulation log file, while the simulation log pane 620 can include a listing of a simulation log 621 corresponding to the simulation log file. Since the transaction pane 610 and the simulation pane 620 can include numerous test bench transactions 611 and lines in the simulation log 621, respectively, the transaction pane 610 and the simulation pane 620 can include scroll bars 618, 623, and 624, respectively, that, when selected or moved, for example, in response to user input, can adjust which portions of the test bench transactions 611 or the simulation log 621 are viewable in the transaction pane 610 and the simulation pane 620, respectively.

In some embodiments, the transaction pane 610 can be arranged in a row-column format, with the rows corresponding to different types of the test bench transactions 611. For example, when a simulation log file includes multiple test bench transactions that share common attributes, such as scope 612, sub-type 613, and/or transaction information 617, the transaction pane 610 can group them together into a single entry in the transaction pane 610.

The columns in the transaction pane 610 can include various attributes of the different types of test bench transactions 611. For example, the transaction pane 610 can include a scope 612 column, which can indicate a particular transaction type. The transaction pane 610 can include a sub-type 613 column, which can indicate a particular transaction sub-type within the transaction type in the scope 612 column. The transaction pane 610 can include a line 614 column, which can indicate a particular line or lines in a simulation log 621 that correspond to the test bench transactions 611. The transaction pane 610 can include a waveform 615 column, which can indicate whether the test bench transactions 611 for the given rows have corresponding waveform data generated by a circuit design during simulation. The transaction pane 610 can include a count 616 column, which can indicate a number of times this particular type of transaction appears in the simulation log 631. The transaction pane 610 can include a transaction information 617 column, which can provide specific transactional information for each of test bench transactions 611.

In some embodiments, when a test bench transaction 611 has corresponding waveform data, the waveform 615 column can include a selectable icon, such as a checkmark, that, when selected, for example, in response to user input, can prompt presentation of the corresponding waveform data. As will be described below in greater detail, in response to the selection of the selectable icon, the waveform data can be presented in a waveform display window alongside of (and temporally synchronized with) the test bench transaction corresponding to the waveform data.

The simulation log pane 620 can include a listing of a simulation log 621 corresponding to the simulation log file. The simulation log 621 can include an execution time 622 field, which can indicate a time when each line of the simulation log 621 was generated during simulation. In some embodiments, a selection of a test bench transaction in the list of test bench transactions 611 can cause a corresponding line or lines of the simulation log 621 corresponding to the selected test bench transaction to automatically scroll in the simulation log pane 620, and in some instances, be highlighted or otherwise have the presentation of the corresponding line or lines of the simulation log 621 altered.

The simulation log display window 601 can include a menu having various mechanisms to selectively populate, sort, organize, and/or filter the transaction pane 610 and the simulation log pane 620 with test bench transactions 611 and simulation log 621, respectively. The menu can include a file mechanism 602 to select a simulation log file for presentation in the transaction pane 610 and the simulation log pane 620. The file name of the selected simulation log file can be presented in the simulation log display window 601, for example, below the menu. The menu can include a type mechanism 603 to select a type of transaction in the simulation log 621 to present in the transaction pane 610. The menu can include a sub-type mechanism 604 to select a sub-type of transactions in the simulation log 621 to present in the transaction pane 610. The menu can include a message mechanism 605 to select a type of simulation log message to present in the transaction pane 610, for example, when a UVM methodology library was utilized to generate the simulation log file, the messages can include a UVM error message, a UVM information message, a UVM warning message, or the like.

The menu can include a time mechanism 606, for example, including multiple icons, to selectively locate different instances of a test bench transaction in the simulation log pane 620. For example, when a test bench transaction having multiple instances (as annunciated by the count 616 column) has been selected in the transaction pane 610, the time icons 606 of the time mechanism can be utilized to prompt the simulation log pane 620 to selectively display the different locations of the test bench transaction in the simulation log 621 based on their execution time 622. A selection of a left time icon 606 in the time mechanism can prompt the simulation log pane 620 to scroll to an instance of the test bench transaction in the simulation log 621 having an earlier execution time 622. A selection of a right time icon 606 in the time mechanism can prompt the simulation log pane 620 to scroll to an instance of the test bench transaction in the simulation log 621 having a later execution time 622.

The menu can include a synchronization mechanism 607 to selectively synchronize the simulation log file selected by the file mechanism 602 with corresponding waveform data. For example, the synchronization mechanism 607 can include a synchronization icon, in this case, having an appearance of a lock, that, when selected, can change the synchronization state of the simulation log file with the waveform data, i.e., between synchronized and unsynchronized. The synchronization icon can represent the synchronization state as synchronized with the lock icon closed, and as unsynchronized with the lock icon opened.

The simulation log display window 601 also can include window icons 608, which can control sizing of the simulation log display window 601, such as enlarging, shrinking, minimizing, or the like, and closing of the simulation log display window 601.

Figure 7:
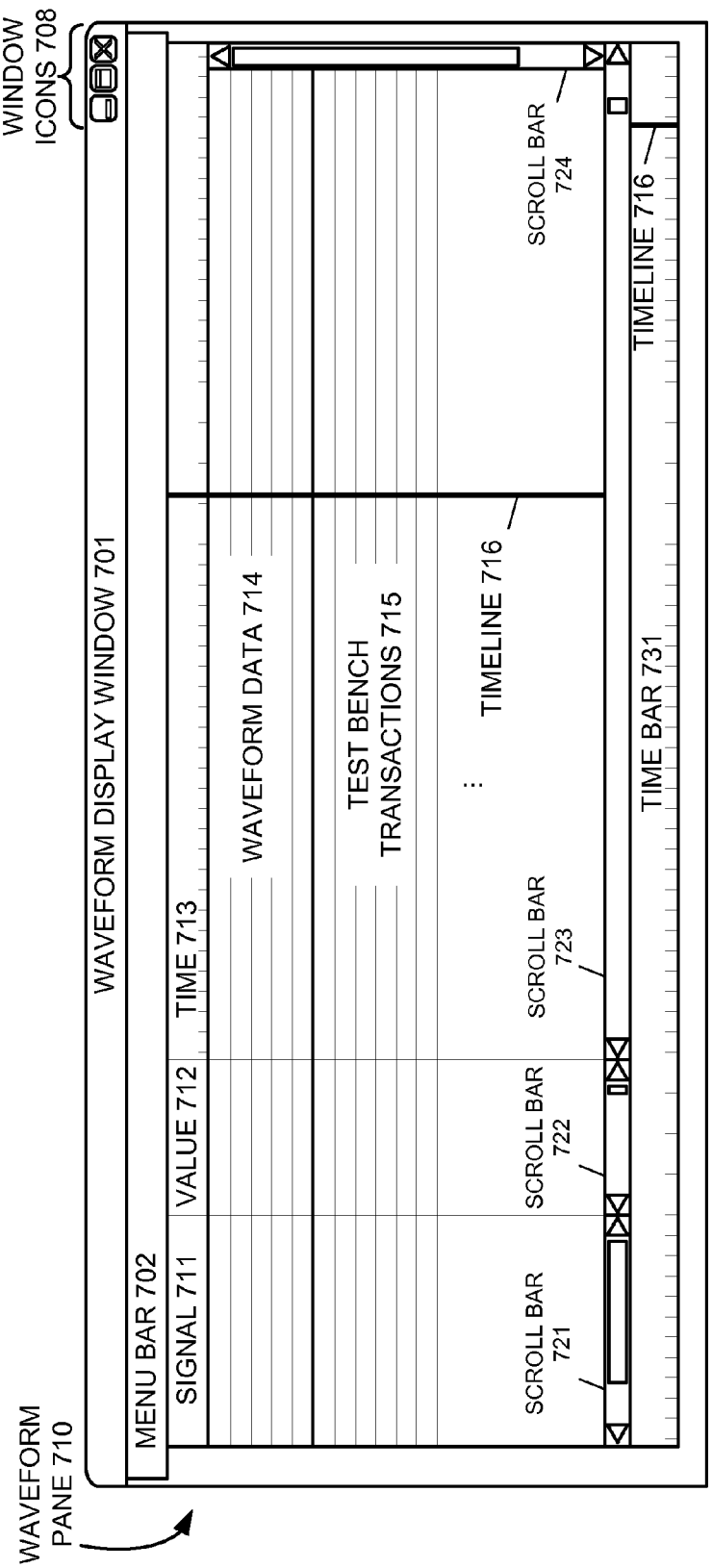
FIG. 7 illustrates an example waveform display window according to various embodiments of the invention.

FIG. 7 illustrates an example waveform display window 701 according to various embodiments of the invention. Referring to FIG. 7, the waveform display window 701 can include a waveform pane 710 to include a list of waveform data 714 and a list of test bench transactions 715 extracted from a simulation log file. The waveform data 714 can correspond to output from a circuit design simulated with a test bench, and the test bench transactions 715 can correspond to stimulus from the test bench that prompted the circuit design to generate the waveform data 714 during simulation.

In some embodiments, the waveform pane 710 can be arranged in a row-column format, with the rows corresponding to different signal waveforms in the waveform data 714 and corresponding test bench transactions 715. The columns in the waveform pane 710 can include various attributes of the waveform data 714 and corresponding test bench transactions 715. For example, the waveform pane 710 can include a signal 711 column, which can indicate a particular signal waveform in the waveform data 714 and a scope of the test bench transactions 715. The waveform pane 710 can include a value 712 column, which can indicate a value of partial (leftmost) signal waveform in the waveform data 714 or the test bench transactions 715.

The waveform pane 710 can include a time 713 column, which can include the waveform data 714 and the corresponding test bench transactions 715 synchronized based on generation time during simulation of the circuit design with the test bench, also called a simulation time. In some embodiments, the test bench transactions 715 can be presented as signal waveforms, similar to the waveform data, or presented as transactional statements. The waveform pane 710 can include scroll bars 721-724, that, when selected or moved, for example, in response to user input, can adjust which portions of the signal 711, the value 712, the time 713 columns are viewable in the waveform pane 710.

The waveform display window 701 can include a time bar 731 having listing of simulation times, and the time 713 column can include listing having a subset of the simulation times in the time bar 731. The waveform pane 710 can include a timeline 716 to indicate which simulation time is presented in the time 713 column. In some embodiments, the timeline 716 can be displayed vertically in the time bar 731 crossing a currently selected simulation time, and displayed vertically in the time 713 column crossing a currently selected simulation time in the time 713 column and optionally the waveform data 714 and the test bench transactions 715.

In some embodiments, operations in the waveform display window 701 can be coordinated with the simulation log display window 601. For example, the waveform display window 701 can be displayed and/or populated with test bench transactions 715 based on one or more selections in the simulation log display window 601. In some instances, a selection of the selectable icon, such as a checkmark, in the waveform 615 column, can prompt an initial display of the waveform display window 701 and optionally prompt population of the waveform display window 701 with waveform data 714 and test bench transactions 715 corresponding to the selected test bench transaction 611. After initially displayed, the waveform display window 701 can be populated with different waveform data 714 and different test bench transactions 715, for example, when a different test bench transaction 611 is selected in the simulation log display window 601. Embodiments of coordination between the waveform display window 701 and the simulation log display window 601 will be described below in greater detail.

The waveform display window 701 can include a menu bar 702 having various mechanisms to selectively sort, filter, organize, populate, or the like the waveform pane 710 with waveform data 714 and/or test bench transactions 715. The waveform display window 701 also can include window icons 708, which can control sizing of the waveform display window 701, such as enlarging, shrinking, minimizing, or the like, and closing of the waveform display window 701.

Figure 8:
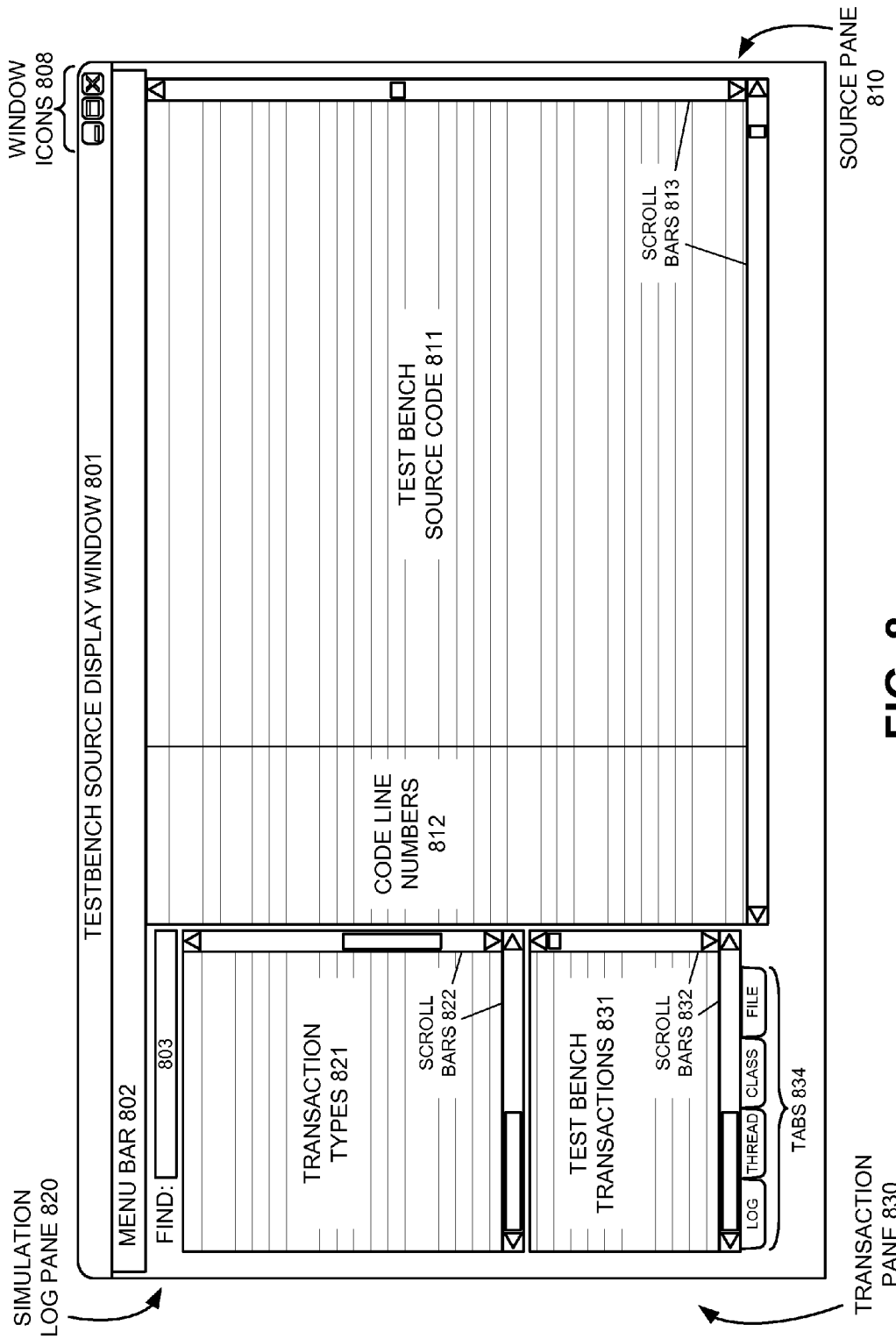
FIG. 8 illustrates an example test bench source display window according to various embodiments of the invention.

FIG. 8 illustrates an example test bench source display window 801 according to various embodiments of the invention. Referring to FIG. 8, the test bench source window 801 can include a source pane 810, a simulation pane 820, and a transaction pane 830. The source pane 810 can include a test bench source code 811, for example, sequenced by code line numbers 812. In some embodiments, the source pane 810 can be arranged in rows, with each row corresponding to different line in the test bench source code 811. The source pane 810 can include scroll bars 813, that, when selected or moved, for example, in response to user input, can adjust which portions of the test bench source code 811 are viewable in the source pane 810.

The simulation pane 820 can include information regarding types of transactions 821 in a simulation log file, such as different transactions extracted from the simulation log file, for example, arranged by their corresponding transaction scope or type. In some embodiments, the simulation pane 820 can be arranged in rows, with each row corresponding to different type of transaction in the simulation log file. The simulation pane 820 can include scroll bars 822, which, when selected or moved, for example, in response to user input, can adjust which transaction types 821 are viewable in the simulation pane 820.

The transaction pane 830 can include test bench transactions 831. In some embodiments, the transaction pane 830 can be arranged in rows, with each row corresponding to different transaction extracted from the simulation log file. The transaction pane 830 can include tabs 834, such as a log tab, thread tab, class tab, file tab, or the like, which can select a format for viewing the test bench transactions 831, and for the transaction types 821 in the simulation log pane 820. The transaction pane 830 can include scroll bars 832, that, when selected or moved, for example, in response to user input, can adjust which portions of the test bench transactions 831 are viewable in the transaction pane 830.

The source pane 810, the simulation pane 820, and the transaction pane 830 can be interrelated, with a selection of a row in one pane causing corresponding portions of the other panes to automatically scroll into view and optionally be highlighted or otherwise have their presentation altered to annunciate their presence in the corresponding panes. For example, a selection of a test bench transaction 831 in the transaction pane 830 can cause a transaction type 821 in the simulation pane 820 and a section of the test bench source code 811 to automatically scroll into view and optionally be highlighted or otherwise have their presentation altered to annunciate their presence.

In some embodiments, operations in the test bench source display window 801 can be coordinated with the simulation log display window 601. For example, the test bench source display window 801 can be displayed and/or populated with the test bench transactions 831 and transaction types 821 based on one or more selections in the simulation log display window 601. In some instances, a selection of a row in the simulation log display window 601 can prompt population of the test bench source display window 801 with the test bench transactions 831 and transaction types 821. Conversely, a selection of a certain section of test bench source code 811 (or other rows or portions in the test bench source display window 801) can cause corresponding test bench transactions 611 and portions of the simulation log 621 to automatically scroll into view in the simulation log display window 601, and optionally be highlighted or otherwise have their presentation altered to annunciate their presence in the simulation log display window 601. Embodiments of coordination between the test bench source display window 801 and the simulation log display window 601 will be described below in greater detail.

The test bench source display window 801 can include a menu bar 802 having various mechanisms to selectively sort, filter, organize, populate, or the like, the source pane 810, the simulation pane 820, and the transaction pane 830. The test bench source display window 801 also can include window icons 808, which can control sizing of the test bench source display window 801, such as enlarging, shrinking, minimizing, or the like, and closing of the test bench source display window 801.

FIG. 9 illustrates a flowchart showing an example implementation of synchronization between a simulation log display window 901 and a waveform display window 902 according to various examples of the invention. Referring to FIG. 9, the simulation log display window 901 and the waveform display window 902 can synchronously display waveform data, test bench transactions, and a simulation log file, such that a selection or an action in one window alters the content and/or presentation of the content in the other window.

When a new test bench transaction 903 is selected in the simulation log display window 901, for example, in response to user input selecting a new line in a list of test bench transactions, selecting a new portion of a simulation log file, or the like, the waveform display window 902 can display waveform data that was generated during simulation in response to the new test bench transaction 903 selected in the simulation log display window 901. The waveform display window 902 can also display the new test bench transaction 903 selected in the simulation log display window 901 in a waveform view or transactional view alongside the waveform data. In some embodiments, the selection of the new test bench transaction 903 can cause the waveform display window 902 to be initially displayed.

When a test bench transaction 904 is selected in the simulation log display window 901 to be added to the waveform display window 902, for example, in response to user input selecting a new line in a list of test bench transactions, selecting a new portion of a simulation log file, or the like, the waveform display window 902 can display waveform data that was generated during simulation in response to the test bench transaction 904 selected in the simulation log display window 901. The waveform display window 902 can also display the test bench transaction 904 selected in the simulation log display window 901 in a waveform view or transactional view alongside the waveform data.

When a new time frame to view waveform data 905 is selected in the waveform display window 902, for example, in response to user input selecting a new time line, the simulation log display window 901 can display test bench transactions and portions of the simulation log file utilized to generate the waveform data during simulation in the new time frame. Although FIG. 9 shows various ways that the simulation display window 901 can be coordinated with the waveform display window 902, in some embodiments, additional data or information can be coordinated between the windows.

FIG. 10 illustrates a flowchart showing an example implementation of synchronization between a test bench transaction display window and a test bench source display window according to various examples of the invention. Referring to FIG. 10, the simulation log display window 1001 and the test bench source display window 1002 can synchronously display test bench transactions, a simulation log file, and a test bench source code, such that a selection or an action in one window alters the content and/or presentation of the content in the other window.

When a new test bench transaction 1003 is selected in the simulation log display window 1001, for example, in response to user input selecting a new line in a list of test bench transactions, selecting a new portion of a simulation log file, or the like, the test bench source display window 1002 can display test bench source code data that was utilized to generate the new test bench transaction 1003 during simulation.

When a new portion of the test bench source code is selected in the waveform display window 902, for example, in response to user input selecting a new line or section in the source code, the simulation log display window 901 can display test bench transactions and portions of the simulation log file that were generated during simulation.

Although FIG. 10 shows various ways that the simulation log display window 1001 can be coordinated with the test bench source display window 1002, in some embodiments, additional data or information can be coordinated between the windows. Also, it should be appreciated that when the techniques described in FIGS. 9 and 10 are both implemented in a computing system, a change or alteration in the waveform display window 902 can cause automatic synchronization in the test bench source display window 1002, and vis versa. In other words, the computing system can implement a debug environment that can synchronize test bench transactions extracted from a simulation log file with waveform data, test bench source data, the simulation log file, a circuit design source code, or the like, based on simulation time and/or line in a log file or source code.

Although FIG. 6-10 show display of data including waveform data, a simulation log file, test bench transactions, and a test bench source code in different display windows, this data can be presented in any number of windows or have the data included one window. Further, any additional data can be added to or any current data can be removed from any of the window or windows described above.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   simulating, by a computing system, a circuit design with a test bench to generate a simulated output for the circuit design and to generate a simulation log storing messages corresponding to operation of the test bench during the simulation of the circuit design;
   parsing, by the computing system, the simulation log to identify which of the messages in the simulation log correspond to test bench transactions based, at least in part, on types of the messages in the simulation log and formats for the test bench transactions; and
   synchronizing, by the computing system, the simulated output for the circuit design with the test bench transactions identified from the simulation log that prompted the generation of the simulated output for the circuit design.

2. The method of claim 1, wherein parsing the simulation log extracts the test bench transactions from the simulation log prior to the synchronization.

3. The method of claim 1, further comprising prompting, by the computing system, display of the test bench transactions and the simulated output for the circuit design in temporal synchronization with each other.

4. The method of claim 3, wherein the simulated output for the circuit design and the test bench transactions are displayed in a common window.

5. The method of claim 1, further comprising receiving, by the computing system, a selection corresponding to a time during the simulation of the circuit design, wherein prompting display of the test bench transactions and the simulated output for the circuit design is performed in response to the selection.

6. The method of claim 1, further comprising:
   synchronizing, by the computing system, a source code for the test bench with the test bench transactions from the simulation log; and
   prompting, by the computing system, display of the source code for the test bench and the test bench transactions in temporal synchronization with each other.

7. The method of claim 6, wherein the source code for the test bench and the test bench transactions are displayed in a common window.

8. The method of claim 6, further comprising receiving, by the computing system, a selection corresponding to a time during the simulation of the circuit design, wherein prompting display of the source code for the test bench and the test bench transactions is performed in response to the selection.

9. The method of claim 1, wherein the simulated output for the circuit design includes waveform data.

10. A system comprising:
a circuit design simulation tool configured to simulate a circuit design with a test bench, generate a simulated output for the circuit design, and generate a simulation log storing messages corresponding to operation of the test bench during the simulation of the circuit design; and
a debug tool configured to parse the simulation log to identify which of the messages in the simulation log correspond to test bench transactions based, at least in part, on types of the messages in the simulation log and formats for the test bench transactions, wherein the debug tool is configured to synchronize the simulated output for the circuit design with the test bench transactions identified from the simulation log that prompted the generation of the simulated output for the circuit design.

11. The system of claim 10, wherein the debug tool is configured to parse the simulation log to extract the test bench transactions from the simulation log prior to the synchronization.

12. The system of claim 10, wherein the debug tool is configured to prompt display of the test bench transactions and the simulated output for the circuit design in temporal synchronization with each other.

13. The system of claim 12, wherein the simulated output for the circuit design and the test bench transactions are displayed in a common window.

14. The system of claim 12, wherein the debug tool is configured to identify a selection corresponding to a time during the simulation of the circuit design, and prompt display of the test bench transactions and the simulated output for the circuit design in response to the selection.

15. The system of claim 10, wherein the debug tool is configured to synchronize a source code for the test bench with the test bench transactions from the simulation log, and prompt display of the source code for the test bench and the test bench transactions in temporal synchronization with each other.

16. The system of claim 15, wherein the source code for the test bench and the test bench transactions are displayed in a common window.

17. The system of claim 15, wherein the debug tool is configured to identify a selection corresponding to a time during the simulation of the circuit design, and prompt display of the source code for the test bench and the test bench transactions in response to the selection.

18. The system of claim 10, wherein the simulated output for the circuit design includes waveform data.

19. A method comprising:
parsing, by a computing system, a simulation log having messages corresponding to operation of a test bench during a simulation of a circuit design based, at least in part, on types of the messages in the simulation log and formats for test bench transactions;
extracting, by the computing system, the test bench transactions from the simulation log based on the parsing; and
synchronizing, by the computing system, the test bench transactions from the simulation log with waveform data generated during the simulation of the circuit design; and
prompting, by the computing system, display of the test bench transactions and the simulated output for the circuit design in temporal synchronization with each other.

20. The method of claim 19, wherein the simulated output for the circuit design and the test bench transactions are displayed in a common window.

21. The method of claim 19, further comprising:
synchronizing, by the computing system, a source code for the test bench with the test bench transactions from the simulation log; and
prompting, by the computing system, display of the source code for the test bench and the test bench transactions in temporal synchronization with each other.

22. The method of claim 21, wherein the source code for the test bench and the test bench transactions are displayed in a common window.

23. The method of claim 21, further comprising receiving, by the computing system, a selection corresponding to a time during the simulation of the circuit design, wherein prompting display of the source code for the test bench and the test bench transactions is performed in response to the selection.

24. The method of claim 19, further comprising receiving, by the computing system, a selection corresponding to a time during the simulation of the circuit design, wherein prompting display of the test bench transactions and the waveform data for the circuit design is performed in response to the selection.

25. An apparatus comprising at least one computer-readable memory device storing instructions configured to cause one or more processing devices to perform operations comprising:
parsing a simulation log having messages corresponding to operation of a test bench during a simulation of a circuit design based, at least in part, on types of the messages in the simulation log and formats for test bench transactions;
extracting the test bench transactions from the simulation log based on the Parsing; and
synchronizing the test bench transactions from the simulation log with waveform data generated during the simulation of the circuit design; and
prompting display of the test bench transactions and the simulated output for the circuit design in temporal synchronization with each other.

26. The apparatus of claim 25, wherein the simulated output for the circuit design and the test bench transactions are displayed in a common window.

27. The apparatus of claim 25, wherein the instructions are configured to cause one or more processing devices to perform operations further comprising:
synchronizing a source code for the test bench with the test bench transactions from the simulation log; and
prompting display of the source code for the test bench and the test bench transactions in temporal synchronization with each other.

28. The apparatus of claim 27, wherein the source code for the test bench and the test bench transactions are displayed in a common window.

29. The apparatus of claim 27, wherein the instructions are configured to cause one or more processing devices to perform operations further comprising receiving a selection corresponding to a time during the simulation of the circuit design, wherein prompting display of the source code for the test bench and the test bench transactions is performed in response to the selection.

30. The apparatus of claim 25, wherein the instructions are configured to cause one or more processing devices to perform operations further comprising receiving a selection corresponding to a time during the simulation of the circuit design, wherein prompting display of the test bench transactions and the waveform data for the circuit design is performed in response to the selection.

31. An apparatus comprising at least one computer-readable memory device storing instructions configured to cause one or more processing devices to perform operations comprising:
   simulating a circuit design with a test bench to generate a simulated output for the circuit design and to generate a simulation log storing messages corresponding to operation of the test bench during the simulation of the circuit design;
   parsing the simulation log to identify which of the messages in the simulation log correspond to test bench transactions based, at least in part, on types of the messages in the simulation log and formats for the test bench transactions; and
   synchronizing the simulated output for the circuit design with the test bench transactions identified from the simulation log that prompted the generation of the simulated output for the circuit design.

32. The apparatus of claim 31, wherein parsing the simulation log extracts the test bench transactions from the simulation log prior to the synchronization.

33. The apparatus of claim 31, wherein the instructions are configured to cause one or more processing devices to perform operations further comprising prompting display of the test bench transactions and the simulated output for the circuit design in temporal synchronization with each other.

34. The apparatus of claim 33, wherein the simulated output for the circuit design and the test bench transactions are displayed in a common window.

35. The apparatus of claim 31, wherein the instructions are configured to cause one or more processing devices to perform operations further comprising receiving a selection corresponding to a time during the simulation of the circuit design, and wherein prompting display of the test bench transactions and the simulated output for the circuit design is performed in response to the selection.

36. The apparatus of claim 31, wherein the instructions are configured to cause one or more processing devices to perform operations further comprising:
   synchronizing a source code for the test bench with the test bench transactions from the simulation log; and
   prompting display of the source code for the test bench and the test bench transactions in temporal synchronization with each other.

37. The apparatus of claim 36, wherein the source code for the test bench and the test bench transactions are displayed in a common window.

38. The apparatus of claim 36, wherein the instructions are configured to cause one or more processing devices to perform operations further comprising receiving a selection corresponding to a time during the simulation of the circuit design, wherein prompting display of the source code for the test bench and the test bench transactions is performed in response to the selection.

39. The apparatus of claim 31, wherein the simulated output for the circuit design includes waveform data.

* * * * *